United States Patent
Van Veen et al.

(10) Patent No.: US 10,388,423 B2
(45) Date of Patent: Aug. 20, 2019

(54) ELECTRICALLY CONDUCTIVE COMPOSITION

(71) Applicant: HENKEL AG & CO. KGAA, Duesseldorf (DE)

(72) Inventors: Adrianus Peter Van Veen, ST Leek (NL); Corina Prent, GD Steenwijk (NL)

(73) Assignee: HENKEL AG & CO. KGAA, Duesseldorf (DE)

( * ) Notice: Subject to any disclaimer, the term of this patent is extended or adjusted under 35 U.S.C. 154(b) by 78 days.

(21) Appl. No.: 14/711,003

(22) Filed: May 13, 2015

(65) Prior Publication Data

US 2015/0248946 A1 Sep. 3, 2015

Related U.S. Application Data

(63) Continuation of application No. 12/722,891, filed on Mar. 12, 2010, now abandoned, which is a continuation of application No. PCT/US2007/078334, filed on Sep. 13, 2007.

(51) Int. Cl.
| | |
|---|---|
| H01B 1/22 | (2006.01) |
| C08L 75/04 | (2006.01) |
| C09D 5/24 | (2006.01) |
| H05K 1/09 | (2006.01) |
| H05K 3/12 | (2006.01) |
| C09D 7/62 | (2018.01) |
| C08K 3/08 | (2006.01) |
| C08K 9/02 | (2006.01) |

(52) U.S. Cl.
CPC ............... *H01B 1/22* (2013.01); *C08L 75/04* (2013.01); *C09D 5/24* (2013.01); *C09D 7/62* (2018.01); *H05K 1/095* (2013.01); *H05K 3/12* (2013.01); *C08K 3/08* (2013.01); *C08K 9/02* (2013.01); *H05K 2201/0218* (2013.01)

(58) Field of Classification Search
CPC ......... H05K 1/09; H05K 3/4069; C09D 11/52
USPC ................... 174/257; 252/511, 512; 428/137
See application file for complete search history.

(56) References Cited

U.S. PATENT DOCUMENTS

| | | |
|---|---|---|
| 3,983,075 A | 9/1976 | Marshall et al. |
| 4,305,847 A | 12/1981 | Stoetzer et al. |
| 4,353,816 A | 10/1982 | Iwasa |
| 4,382,981 A | 5/1983 | Stoetzer et al. |
| 4,387,115 A | 6/1983 | Kitamura et al. |
| 4,705,647 A | 11/1987 | Yamaguchi et al. |
| 4,716,081 A | 12/1987 | Ehrreich |
| 4,747,966 A | 5/1988 | Maeno et al. |
| 4,777,205 A | 10/1988 | La Scola et al. |
| 4,781,980 A | 11/1988 | Yoshitake et al. |
| 4,789,411 A | 12/1988 | Eguchi et al. |
| 4,801,489 A | 1/1989 | Nakagawa et al. |
| 4,818,438 A | 4/1989 | Wiley |
| 4,830,779 A | 5/1989 | Maeno et al. |
| 4,833,033 A | 5/1989 | Sannohe et al. |
| 4,888,135 A | 12/1989 | Tsunaga et al. |
| 4,888,216 A | 12/1989 | Sannohe et al. |
| 4,921,623 A | 5/1990 | Yamaguchi et al. |
| 5,045,236 A | 9/1991 | Tsunaga et al. |
| 5,068,150 A | 11/1991 | Nakamura et al. |
| 5,175,024 A | 12/1992 | Mack |
| 5,225,110 A | 7/1993 | Kathirgamanathan |
| 5,248,451 A | 9/1993 | Tsunaga et al. |
| 5,372,749 A | 12/1994 | Li et al. |
| 5,736,070 A | 4/1998 | Murakami et al. |
| 5,744,285 A | 4/1998 | Felten et al. |
| 5,855,820 A | 1/1999 | Chan et al. |
| 6,096,413 A | 8/2000 | Kalinoski et al. |
| 6,241,914 B1 | 6/2001 | Schleifstein |
| 7,037,447 B1* | 5/2006 | Yang ..................... C09D 11/52 252/512 |
| 7,108,806 B2 | 9/2006 | Xiao et al. |
| 8,071,888 B2 | 12/2011 | Shiraishi et al. |
| 2002/0062990 A1* | 5/2002 | Kikuchi ............... H05K 3/4069 174/264 |
| 2003/0178604 A1 | 9/2003 | Okada et al. |
| 2004/0026669 A1 | 2/2004 | Sano et al. |
| 2005/0224764 A1 | 10/2005 | Ma et al. |
| 2006/0043346 A1 | 3/2006 | Kodas et al. |
| 2006/0086927 A1 | 4/2006 | Don et al. |
| 2006/0137488 A1 | 6/2006 | Sakaue et al. |
| 2006/0145125 A1 | 7/2006 | Kuwajima et al. |
| 2007/0116961 A1 | 5/2007 | Connell et al. |
| 2007/0164260 A1 | 7/2007 | Kuwajima |

(Continued)

FOREIGN PATENT DOCUMENTS

| | | |
|---|---|---|
| CN | 1788323 A | 6/2006 |
| CN | 101000810 A | 7/2007 |
| EP | 0144849 A2 | 6/1985 |
| EP | 0170063 A2 | 2/1986 |
| EP | 0209395 A2 | 1/1987 |
| EP | 0470262 A1 | 2/1992 |
| EP | 1284278 A2 | 2/2003 |

(Continued)

OTHER PUBLICATIONS

Mori, K. et al. "Conductivity of Copper Powders With and Without Surface Treatment," Powder Technology, Elsevier Sequoia, vol. 59, 1989, pp. 191-197.

(Continued)

*Primary Examiner* — Khanh T Nguyen

(74) *Attorney, Agent, or Firm* — Steven C. Bauman

(57) ABSTRACT

An electrically conductive composition comprising a binder and filler particles in which at least a portion of the particles are silver-plated. In one embodiment the composition comprises a binder such as a polyurethane, electrically conductive filler particles, silver-plated filler particles and solvent.

10 Claims, No Drawings

(56) References Cited

U.S. PATENT DOCUMENTS

| | | |
|---|---|---|
| 2008/0206488 A1 | 8/2008 | Chung et al. |
| 2009/0220738 A1 | 9/2009 | Oka et al. |
| 2010/0300618 A1 | 12/2010 | Frackmann et al. |

FOREIGN PATENT DOCUMENTS

| | | |
|---|---|---|
| EP | 1454688 A1 | 9/2004 |
| JP | 02053869 A | 2/1990 |
| JP | 06336563 A | 12/1994 |
| JP | 08161929 A | 6/1996 |
| JP | 09180542 A | 7/1997 |
| JP | 10134636 A | 5/1998 |
| JP | 2002332502 A | 11/2002 |
| JP | 2004055558 A | 2/2004 |
| JP | 2004056148 A | 2/2004 |
| JP | 2004068111 A | 3/2004 |
| JP | 2004149817 A | 5/2004 |
| JP | 2004156061 A | 6/2004 |
| JP | 2004156062 A | 6/2004 |
| JP | 2004162164 A | 6/2004 |
| JP | 2004183060 A | 7/2004 |
| JP | 2004211108 A | 7/2004 |
| JP | 2004217991 A | 8/2004 |
| TW | 396196 B | 7/2000 |
| WO | 2004040590 A2 | 5/2004 |

OTHER PUBLICATIONS

Ding, Jianfu et al. "The Dynamic Mechanical Analysis of Epoxy-Copper Powder Composites Using Azole Compounds as Coupling Agents," Journal of Applied Polymer Sciense, John Wiley & Sons, Inc., vol. 42, (1991), pp. 1459-1464.

Mori, K. et al. "Effects of the loadings and type of copper powder on the electrical resistivity of copper powder-polymer paint films," Journal of Materials Science, Chapman & Hall, vol. 28, (1993), pp. 367-372.

Jin, S. et al. "Effect of some aromatic nitro compounds on the passivation of copper anodes during electrorefining," Journal of Applied Electrochemistry, Chapman and Hall, Ltd., vol. 21, 1991, pp. 247-254.

Stein, N. et al. "In-situ ellipsometric study of copper passivation by copper heptanoate through electrochemical oxidation," Electrochimica Acta, Elsevier Science, Ltd., vol. 43, Nos. 21-22, 1998, pp. 3227-3234.

Babic, R. et al. "Impedance and Photoelectrochemical study of surface layers on Cu and Cu-10Ni in acetate solution containing benzotriazole," Electrochimica Acta, Elsevier Science, Ltd., vol. 44, 1999, pp. 2413-2421.

Milone, M.G. et al. "Chimeric Receptors Containing CD137 Signal Transduction Domains Mediate Enhanced Survival of T Cells and Increased Antileukemic Efficacy In Vivo," The American Society of Gene & Cell Therapy, Molecular Therapy, vol. 17, No. 8, Aug. 2009, pp. 1453-1464.

\* cited by examiner

ELECTRICALLY CONDUCTIVE COMPOSITION

CROSS-REFERENCE TO RELATED APPLICATION

This is a continuation application of U.S. patent application Ser. No. 12/722,891, filed Mar. 12, 2010, which is a continuation of International Application No. PCT/US2007/078334 filed Sep. 13, 2007, the contents of all of which are incorporated herein by reference.

FIELD OF THE INVENTION

This invention relates to an electrically conductive composition containing silver-plated filler particles.

BACKGROUND OF THE INVENTION

Silver is utilized as an electrically conductive filler in many commercially available electrically conductive coatings, and encapsulants because its oxide is electrically conductive, and therefore, silver filled systems encounter little or no loss of conductivity during high temperature curing, aging, or other conditions under which the silver may be oxidized. A disadvantage of the use of silver is its high cost and the risk of silver migration within the system.

The high level of conductivity and low resistance provided by entirely silver-filler based products are not necessary for all conductive material applications. Some applications do not require such high levels of conductivity and low resistance. Copper is another conductive material that may be utilized because it is capable of being processed in forms similar to those in which silver is available, i.e., in powder, dendritic and flake form. The main disadvantage of copper is that its oxide is not conductive, and any surface copper oxide formed during drying or curing limits the conductivity of the system even if close interparticle contact is created. Likewise, many other materials that provide electrical conductivity oxidize under the conditions necessary for formation of a conductive coating.

There continues to be a need in the art for a more economical electrically conductive composition. The present invention addresses this need.

SUMMARY OF THE PRESENT INVENTION

The present invention provides an electrically conductive composition comprising a binder, filler particles, in which at least a portion of the filler particles are silver-plated, and optionally, solvent. With the use of silver-plated fillers, the sheet resistivity of the composition is lower than 0.100 Ohm/square at 25 µm.

Another embodiment provides electronic devices manufactured using the electrically conductive composition of the invention.

Still another embodiment is directed to a process of making or forming an electronic device using the electrically conductive composition of the invention. The process comprises dispensing, for example, by stencil, screen, rotogravure or flexo printing, the electrically conductive composition of the invention onto a substrate to form conductive tracts or electronic circuitry, and then curing and/or drying the composition to obtain conductivity. Exemplary electronic devices that might use these electrically conductive compositions encompass computers and computer equipment, such as printers, fax machines, scanners, keyboards and the like; household appliances; medical sensors; automotive sensors and the like; and personal electronic devices, such as telephones, mobile phones, calculators, remote controls, cameras, CD-players, DVD-players, cassette tape recorders and the like.

DETAILED DESCRIPTION OF THE PRESENT INVENTION

The binder component of the electrically conductive coating or encapsulant will comprise a thermoplastic system, a thermoset system or a mixture of thermoset and thermoplastic systems.

The thermoplastic system of the binder component is either a functional or a non-functional thermoplastic polymer. Suitable thermoplastic polymers include, but are not limited to, polyurethane elastomers, polyesters, phenolic resins, acrylic polymers, acrylic block copolymers, acrylic polymers having tertiary-alkyl amide functionality, polysiloxane polymers, polystyrene copolymers, polyvinyl polymers, divinylbenzene copolymers, polyetheramides, polyvinyl acetals, polyvinyl butyrals, polyvinyl acetols, polyvinyl alcohols, polyvinyl acetates, polyvinyl chlorides, methylene polyvinyl ethers, cellulose acetates, styrene acrylonitriles, amorphous polyolefins, thermoplastic urethanes, polyacrylonitriles, ethylene vinyl acetate copolymers, ethylene vinyl acetate terpolymers, functional ethylene vinyl acetates, ethylene acrylate copolymers, ethylene acrylate terpolymers, ethylene butadiene copolymers and/or block copolymers, styrene butadiene block copolymers, and mixtures thereof. Commercially available binder that may be utilized is ESTANE 5703P, which is a polyester-type thermoplastic polyurethane available from Noveon, Ohio, USA; PKHC, which is a phenoxy resin available from Inchem, S.C., USA; and UCAR VAGH, which is a copolymer of polyvinylalcohol, polyvinylacetate and polyvinylchloride commercially available from the Dow Chemical Company.

The thermoset system of the binder component is either a functional or a non-functional thermoset polymer. Suitable thermoset polymers include, but are not limited to, phenolics, urethanes, phenoxy resins, polyesters, epoxies, melamines and mixtures thereof. One commercially available binder that may be utilized is Bakelite Hartz 9132KP, which is a phenolic resin commercially available from Bakelite.

The total binder content is typically in the range of about 2 to about 50 weight percent of the composition and preferably in the range of about 2 to about 40 weight percent of the composition.

One or more silver-plated fillers are utilized in the composition. The core of the silver-plated fillers can be electrically conductive or electrically non-conductive. A combination of silver-plated fillers, with electrically conductive core and with electrically non-conductive core, may be used. Exemplary cores include, but are not limited to, copper, nickel, palladium, carbon black, carbon fiber, graphite, aluminum, indium tin oxide, glass, polymers, antimony doped tin oxide, silica, alumina, fiber, clay, and mixtures thereof.

In one embodiment the core of the silver-plated filler particle is copper. The silver content of the silver-plated filler must be sufficient to provide adequate electrical conductivity and is typically in the range of about 0.2 to about 25 weight percent of the silver-plated filler.

The one or more silver-plated filler particles comprise in the range of about 1 to about 99 weight percent of the composition and preferably in the range of about 20 to about 70 weight percent of the composition.

Optionally, one or more electrically conductive filler materials are utilized in the composition in addition to the silver-plated fillers particles. Exemplary conductive filler materials include, but are not limited to, silver, copper, gold, palladium, platinum, nickel, gold or silver-coated nickel, carbon black, carbon fiber, graphite, aluminum, indium tin oxide, silver coated copper, silver coated aluminum, metallic coated glass spheres, metallic coated filler, metallic coated polymers, silver coated fiber, silver coated spheres, antimony doped tin oxide, conductive nanospheres, nano silver, nano aluminum, nano copper, nano nickel, carbon nanotubes and mixtures thereof. The electrically conductive filler material may be the same as or different than the core of any silver-plated filler particle utilized in the composition. The one or more electrically conductive filler materials comprise in the range of about 0 to about 99 weight percent of the composition and preferably in the range of up to about 40 weight percent of the composition.

The viscosity of the composition can be adjusted with solvents. It is generally preferred that the composition have a low viscosity to enable efficient dispensing, stencil or screen printing of the composition. In one embodiment the composition has a viscosity in the range of about 50 to about 150,000 mPas, and in another embodiment is in the range of about 500 to about 50,000 mPas. The lower range of viscosity, from about 500 to about 4,000 mPas, is preferred for rotogravure or flexo printing of the composition. Higher range of viscosity, from about 3,000 to 50,000 mPas, is preferred for dispensing, stencil or screen printing the composition.

Exemplary solvents that may be utilized, either separately or in combination, are glycidyl ethers, for example 1,4-butanediol diglycidyl ether; p-tert-butyl-phenyl glycidyl ether, allyl glycidyl ether, glycerol diglycidyl ether, butyldiglycol, 2-(2-butoxyethoxy)-ethylester, butylglycolacetate, acetic acid, 2-butoxyethylester, butylglycol, 2-butoxyethanol, isophorone, 3,3,5 trimethyl-2-cyclohexene-1-one, dimethylsuccinate, dimethylglutarate, dimethyladipate, water, acetic acid, dipropylene glycol (mono)methyl ether, propylacetate, glycidyl ether of alkyl phenol (commercially available from Cardolite Corporation as Cardolite NC513), although other solvents may be utilized.

Additional ingredients, such as organic additives, may be included in the formulation to provide desired properties. Various additives that may be included are surface active agents, surfactants, wetting agents, antioxidants, thixotropes, reinforcement materials, silane functional perfluoroether, phosphate functional perfluoroether, silanes, titanates, wax, phenol formaldehyde, air release agents, flow additives, adhesion promoters, rheology modifiers, surfactants, spacer beads and mixtures thereof. The ingredients are specifically chosen to obtain the desired balance of properties for the use of the resins utilized in the particular composition. The additional ingredient comprises up to about 20 weight percent of the composition and preferably up to about 10 weight percent of the composition.

The composition is combined and then applied by dispensing, stencil, screen, rotogravure or flexo printing onto a substrate to form conductive tracts or electronic circuitry, followed by curing and/or drying to produce conductivity. Typically, the composition is cured and/or dried at 120° C. for about 10 minutes. The composition may be cured and/or dried at higher temperatures for less time. In general, these compositions provide sheet resistivity of less than 0.100 Ohm/square at 25 µm.

EXAMPLES

The invention is further illustrated by the following non-limiting example.

A comparative Sample 1 and Samples A-G were prepared by dissolving the binder in a heated solvent (40° C.) with stirring until a homogenous mixture was formed, The samples were cooled to room temperature, filler was added, and the mixture stirred for an additional 30 minutes. As needed, a 3-roll mill (Buhler) was used to mil the compositions. Each composition was applied as a track of 100×2 mm with a thickness of about 5-8 µm on a polyester sheet. The composition was cured and/or dried at 120° C. for 10 minutes, after which the sheet resistance was measured using a Keithley 2000 Multimeter. Sheet resistivity (SR) was calculated by the formula:

$$SR = \frac{R(tr) \times W(tr) \times H(tr)}{L(tr) \times 25},$$

where
R(tr)=Resistance track (in Ohm)
W(tr)=Width of the track (in mm)
H(tr)=Thickness of the track (in µm)
L(tr)=Length of the track (in mm)

The formulations of the compositions and the sheet resistivity for each are reported in Table 1: Compositions and Sheet Resistivity.

TABLE 1

| Formulation Components | 1 (g) | A (g) | B (g) | C (g) | D (g) | E (g) | F (g) | G (g) |
|---|---|---|---|---|---|---|---|---|
| Binder - ESTANE 5703P[1] | 5.2 | 5.2 | 5.2 | 5.2 | 5.4 | | | |
| Binder - UCAR VAGH[2] | 4.0 | 4.0 | 4.0 | 4.0 | 4.2 | | 6.5 | |
| Binder - PKHC[3] | | | | | | 9.1 | | |
| Binder - Bakelite Hartz 9132KP[4] | | | | | | | | 16.0 |
| Solvent - Dibasicesters[5] | 40.8 | 40.8 | 40.8 | 40.8 | 34.3 | | | |
| Solvent - Butylglycolacetate[6] | | | | | | 27.3 | | |
| Solvent - Propylacetate[7] | | | | | | | 28.5 | |
| Solvent - Arcosolv DPM[8] | | | | | | | | 12.6 |
| Filler - Silver flake[9] | 50.0 | 30.0 | 35.0 | 25.0 | | | | |
| Filler - Silver plated copper ZS-710[10] | | 20.0 | 15.0 | 25.0 | | | | |
| Filler - Silver plated copper NZS 610[11] | | | | | 52.3 | 63.6 | 65.0 | 65.5 |
| Organic Additive - BYK 354[12] | | | | | | | | 0.65 |
| Organic Additive - Glycerol[13] | | | | | | | | 5.81 |

TABLE 1-continued

| Formulation Components | 1 (g) | A (g) | B (g) | C (g) | D (g) | E (g) | F (g) | G (g) |
|---|---|---|---|---|---|---|---|---|
| Sheet Resistivity (Ohm/square at 25 μm) | 0.010 | 0.032 | 0.024 | 0.040 | 0.050 | 0.032 | 0.019 | 0.084 |

[1]Polyester-type thermoplastic polyurethane available from Noveon, Ohio, USA
[2]Vinylchloride vinylalcohol vinylacetate copolymer available from Dow Chemical, Belgium
[3]Phenoxy resin available from Inchem, South Carolina, USA
[4]Phenolicresin available from Bakelite, Germany
[5]Mixture of dimethylsuccinate, dimethyladipate and dimethyglutarate available from Keyser & McKay, Netherlands
[6]2(2-butoxy-ethoxy) ethanol available from Chemproha, Netherland
[7]n-propylacetate available from Chemproha, Netherland
[8]Dipropylene Glycol (Mono)Methyl Ether available from Arco, Missouri, USA
[9]Silver flake available from Ferro, Ohio, USA
[10]Silver plated copper available from Ames Goldsmith, New York, USA
[11]Silver plated copper available from Ames Goldsmith, New York, USA
[12]Polyacrylate in solution available from BYK, Germany
[13]1,2,3 propanetriol available from Chemproha, Netherland Comparative Sample 1 with silver flake filler had a sheet resistivity of 0.010 Ohms/square at 25 μm. Samples made with mixtures of silver flakes and silver plated coppers (Samples A-C) had comparable sheet resistivity to the Comparative Sample 1 and acceptable sheet resistivity, lower than 0.100 Ohm/square at 25 μm. Samples made with only silver plated copper, without any silver flakes (Samples D-G), also resulted in comparable sheet resistivity values to Comparative Sample 1, and acceptable sheet resistivity, lower than 0.100 Ohm/square at 25 μm. Samples D-G demonstrated that various binder systems may be used to result in comparable sheet resistivity values as Comparative Sample 1, and acceptable sheet resistivity, lower than 0.100 Ohm/square at 25 μm.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. An electrically conductive composition comprising
   (i) a binder selected from the group consisting of polyurethane elastomers, copolymers of polyvinylalcohol, polyvinylacetate and polyvinylchloride and mixtures thereof, wherein the binder is present in an amount of about 2 weight percent to about 50 weight percent of the composition;
   (ii) a conductive filler comprising a mixture of:
      (a) particles having a core plated with silver, wherein the core is selected from the group consisting of copper, nickel, palladium, carbon black, carbon fiber, graphite, aluminum, indium tin oxide, glass, polymers, antimony doped tin oxide, silica, alumina, fiber, clay, and mixtures thereof,
      wherein the particles having a core plated with silver are present in the amount of from about 20 weight percent to about 70 weight percent of the composition, and
      (b) an electrically conductive filler material selected from the group consisting of silver, copper, gold, palladium, platinum, nickel, gold or silver-coated nickel, carbon black, carbon fiber, graphite, aluminum, indium tin oxide, silver coated copper, silver coated aluminum, metallic coated glass spheres, metallic coated filler, metallic coated polymers, silver coated fiber, silver coated spheres, antimony doped tin oxide, conductive nanospheres, nano silver, nano aluminum, nano copper, nano nickel, carbon nanotubes or mixtures thereof;
      in which the particles (a) make up about 30 to about 40 weight percent of the total conductive filler and the filler material (b) comprises about 60 to about 70 weight percent of the total conductive filler, and
   (iii) a solvent comprising one or more dibasic esters;
   wherein said composition has a sheet resistivity of less than about 0.100 Ohm/square at 25 micron.

2. The electrically conductive composition of claim 1, wherein the core is copper.

3. The electrically conductive composition of claim 1, wherein the composition further comprising surface active agents, surfactants, wetting agents, antioxidants, thixotropes, reinforcement materials, silane functional perfluoroether, phosphate functional perfluoroether, silanes, titanates, wax, phenol formaldehyde, air release agents, flow additives, adhesion promoters, rheology modifiers, surfactants, spacer beads or mixtures thereof.

4. The electrically conductive composition of claim 1, wherein the composition comprises the binder in the amount of about 2 to about 40 weight percent of the composition.

5. The electrically conductive composition of claim 1, wherein the electrically conductive filler comprises in the range of up to about 40 weight percent of the composition.

6. The electrically conductive composition of claim 1, wherein the electrically conductive composition comprises silver plated copper particles, and silver flake.

7. A process for making or forming an electronic device with the electrically conductive composition of claim 6 comprising applying the electrically conductive composition by dispensing, stencil, screen rotogravure or flexo printing onto a substrate to form conductive tracts or electronic circuitry, and curing and/or drying said electrically conductive composition at about 120° C. for about 10 minutes.

8. An electronic device comprising the electrically conductive composition of claim 1.

9. A process for making or forming an electronic device with the electrically conductive composition of claim 1 comprising applying the electrically conductive composition by dispensing, stencil, screen rotogravure or flexo printing onto a substrate to form conductive tracts or electronic circuitry, and curing and/or drying said electrically conductive composition at about 120° C. for about 10 minutes.

10. The electrically conductive composition of claim 1, wherein the solvent is present in the amount of about 27 weight percent to about 41 weight percent of the composition.

* * * * *